(12) United States Patent
Lundberg et al.

(10) Patent No.: US 8,107,659 B2
(45) Date of Patent: Jan. 31, 2012

(54) CONTROL ARRANGEMENT FOR HEARING AIDS OR FOR CONTROL UNITS COUPLED TO HEARING AIDS

(75) Inventors: Per Lundberg, Smørum (DK); Thomas Bill, Lyngby (DK)

(73) Assignee: Oticon A/S, Smorum (DK)

( * ) Notice: Subject to any disclaimer, the term of this patent is extended or adjusted under 35 U.S.C. 154(b) by 943 days.

(21) Appl. No.: 12/076,662

(22) Filed: Mar. 20, 2008

(65) Prior Publication Data
US 2009/0046877 A1 Feb. 19, 2009

(30) Foreign Application Priority Data

Apr. 17, 2007 (EP) .................................... 07106323

(51) Int. Cl.
*H04R 25/00* (2006.01)
(52) U.S. Cl. .................. 381/323; 381/314; 381/324
(58) Field of Classification Search .................. None
See application file for complete search history.

(56) References Cited

U.S. PATENT DOCUMENTS

| | | | |
|---|---|---|---|
| 4,369,391 A * | 1/1983 | Micheron | 310/332 |
| 5,341,433 A | 8/1994 | Meyer et al. | |
| 6,269,266 B1 | 7/2001 | Leysieffer et al. | |
| 2003/0094355 A1* | 5/2003 | Angst | 200/302.1 |
| 2004/0062410 A1* | 4/2004 | Wagner et al. | 381/330 |
| 2005/0117763 A1* | 6/2005 | Svendsen et al. | 381/315 |
| 2006/0159298 A1* | 7/2006 | von Dombrowski et al. | 381/330 |
| 2006/0215847 A1* | 9/2006 | Hollemans et al. | 381/74 |

FOREIGN PATENT DOCUMENTS

WO WO-2006/077519 A1 7/2006

* cited by examiner

*Primary Examiner* — Hoang-Quan Ho
(74) *Attorney, Agent, or Firm* — Birch, Stewart, Kolasch & Birch, LLP

(57) ABSTRACT

In a control arrangement for hearing aids or for control units coupled to hearing aids, a strain gauge is mechanically coupled to an elastically deformable or displaceable portion of the hearing aid or of the control unit coupled thereto and undergoes an elastic deformation under the influence of an actuating force input by a user, whereby the strain gauge undergoes a variation of one of its electrical values which variation is detected by a controller which provides a control signal which serves for switching between different operation modes of the hearing aid or of the control unit coupled to the hearing aid.

8 Claims, 5 Drawing Sheets

CONTROL ARRANGEMENT FOR HEARING AIDS OR FOR CONTROL UNITS COUPLED TO HEARING AIDS

BACKGROUND OF THE INVENTION

In the hearing aid technology with the ongoing demand for miniaturization of hearing aids and of control units allocated thereto and carried on by the user in proximity to the respective hearing aid, switching functions to be initiated by the user have to be verified and, hitherto, have been implemented by push bottom elements activated by applying a force thereto by the user and, in turn, being mechanically coupled to galvanic contacts for generating an electric switching signal.

These push bottom elements with the electrical contacts operated thereby are space consuming and cause difficulties in practical use because they are prone to wear problems and because of their sensitivity to contamination by substances as sweat, dust and the like which may cause temporal malfunction or even inoperativeness of the respective system.

DISCUSSION OF PRIOR ART

It is known from U.S. Pat. No. 6,143,440 A to keep the pressure of a rechargeable battery under watch by detecting the shape of an elastically deformable battery housing whereby a switching element is operated upon a predetermined deformation of the battery housing.

A similar system for monitoring the pressure within a battery cell is disclosed in WO 2006/077519 A1. Here it is a strain gauge which monitors the mechanical deformation of the battery cell.

SUMMARY OF THE INVENTION

It is an object of the present invention to provide a control arrangement for hearing aids or for control units coupled to hearing aids which verifies a reliable switching function or control function also in a problematic environment with regard to possible contamination by moisture, dust and dirt, is not prone to wear problems and, particularly, despite of a high degree of miniaturization, can be easily and correctly operated by the user who may be disturbed and irritated by the general difficulties inherent with hearing problems.

This object, in accordance with the present invention, is achieved by a control arrangement with the features of enclosed claim 1. Thus, the control arrangement comprises a strain gauge mechanically coupled to the inner surface of an elastically deformable or displaceable portion of the hearing aid or of the control unit and being elastically deformed under the influence of the activating force input by the user, wherein said strain gauge undergoes a variation of at least one of its electrical values dependent from the input of the actuating force. A controller is electrically connected to the strain gauge and transforms the variation of said at least one of the electrical values of the strain gauge into the control signal which finally verifies the switching function. The controller is free of galvanic closing and opening contacts and, therefore, does not contribute anything to wear problems or is prone to being attacked by corrosion.

After termination of the mechanical activating force input by the user, the strain gauge returns back into its unactuated shape elastically. This spring back movement just as the elastic mechanical resistance counteracting the mechanical actuating force input by the user is generated either by the elastic properties of the strain gauge itself or by the elastic properties of the portion of the hearing aid or the control unit the inner surface of which supports the strain gauge or by the elastic properties of both components in combination or, furthermore, by the elastic properties of a support carrying the strain gauge or, finally, by a separate spring acting on the strain gauge and on the supporting hearing aid portion or control unit portion in counteraction to the mechanical actuating force input by the user.

The concept briefly described before enables hearing aid designs with switching function wherein the hearing aid is totally sealed against the environment and, nevertheless, offers sensitive switching functions and control functions to the user.

Preferably the strain gauge is provided on the surface of the respective portion of the hearing aid or of the control unit coupled thereto by MID technique or Molded Interconnect Device technique. The strain gauge can be provided on the respective part of the surface reliably and can be connected to further circuit components in molded-in fashion.

In an embodiment of the invention the electrical value which is changed is the resistance or the capacitance or the inductance of said strain gauge. Also combinations of the mentioned values may be changed, and this change may be recorded in the control unit.

A very simple way of making a strain gauge is to use a piezoelectrical material which when deformed may generate an electrical potential between two surface parts, and this potential may readily be observed in the control unit.

The arrangement may be made in a way wherein the strain gauge, under the influence of said actuating force, is compressed or expanded or bent or twisted.

In an arrangement according to the invention the strain gauge is provided in or on an elastically deformable cantilever support being part of a molded interconnect device. This is a particularly advantageous way of provided the strain gauge, as the processes used to generate electric leads on or in molded interconnect devices may also be used to produce the strain gauge. In this way solder points or the like interconnections to the strain gauge device is avoided. Further, possibly no additional processes apart from what is needed to provide the electrical leads need to be performed on the molded interconnect device in order to achieve the strain gauge at a particular point.

In an embodiment a support is deformable by mechanical deformation or displacement of a portion of a casing of the hearing aid or the control unit coupled thereto. In this manner a part of the hearing aid casing, such as the battery lid may be used to invoke a force onto the cantilever support.

The invention is applicable to both in the ear and behind the ear hearing aids. Also in other kinds of audiological prosthesis this technique is applicable such as in cochlear implants, bone conduction hearing aids and body worn hearing aids.

BRIEF DESCRIPTION OF THE DRAWINGS

The understanding by a skilled person of the invention as defined in claim 1 and in the further dependent claims which are directed to special embodiments and improvements, is facilitated by the following description of some exemplary embodiments with reference to the drawings. It should be noted that the subject-matter of the sub-claims is herewith made part of the specification without repeating here their wording.

DESCRIPTION OF EMBODIMENTS OF THE INVENTION

Figure 1:
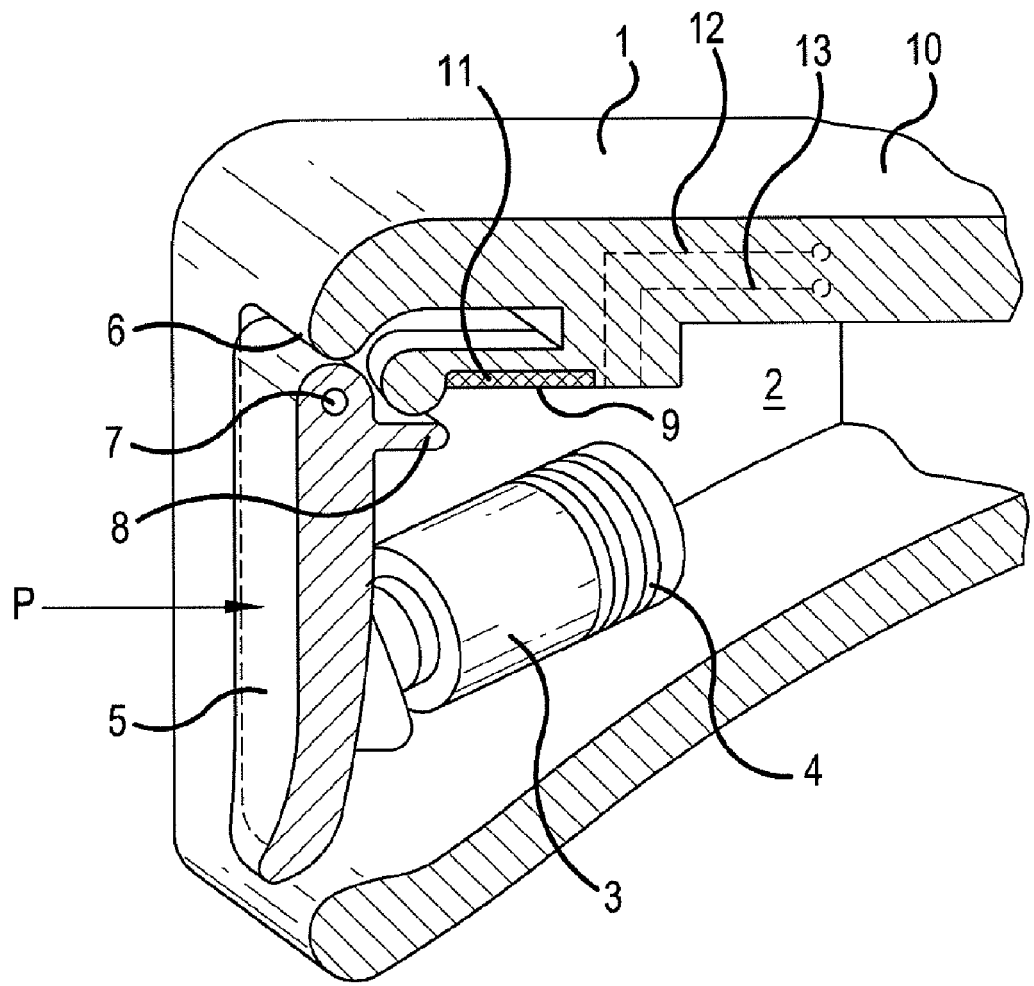
FIG. 1 is a schematic isometric view, partly shown in section, of a behind the ear worn hearing aid showing only those parts which are of interest for understanding the present invention.

A behind the ear worn hearing aid component shown in FIG. 1 comprises a substantially triangular shaped casing 1 of plastic material. This casing may be composed of parts fabricated as molded interconnect devices and sealingly assembled, whereby details in this respect are not shown in FIG. 1. The inner space 2 of the casing 1 houses a battery 3 which is supported within the space 2 by a support frame (not shown) and is urged by spring means 4 against a lid 5 which serves for closing an opening 6 of the casing 1 which opening, in the position of practical use of the device, is on the rear lower end surface of the casing.

The lid 5 is pivotably connected to the casing 1 by an axle 7 and is provided with a plate like extension 8 protruding in direction to the inner space 2 of the casing 1.

When the lid 5 is in the closed position as shown in FIG. 1, the plate like extension 8 contacts a cantilever support 9 which is integrally molded with the upper wall 10 of the casing 1. This upper wall 10 or at least part thereof is formed as a molded interconnect device.

The cantilever support 9 comprises a strain gauge 11, which may comprise a Cu—Ni alloy embedded, in a pattern, in the lower part of the cantilever support 9 or bonded thereto.

When an actuating force P is exerted onto the lid 5 against the spring force of the spring means 4 or against separate spring means acting on the lid 5, the lid is displaced by a small angle in counter-clockwise direction relative to the position of FIG. 1 so that the plate like extension 8 presses the cantilever support 9 upwards. Thereby, the resistance of the strain gauge 11 is changed. Since this resistance is monitored by a controller not shown in FIG. 1 via the measuring lines 12 and 13 embedded in the upper wall 10 of the casing 1, a control signal is generated by the controller as a consequence of the input of the actuating force P on the lid 5. This control signal may be used by the circuitry of the hearing aid for switching from one operation mode to another or for switching on and off predetermined functions. It is noted that this control arrangement does not initiate a switching between operation modes or a switching on or off of functions by mechanical electrical contacts.

Figure 2:
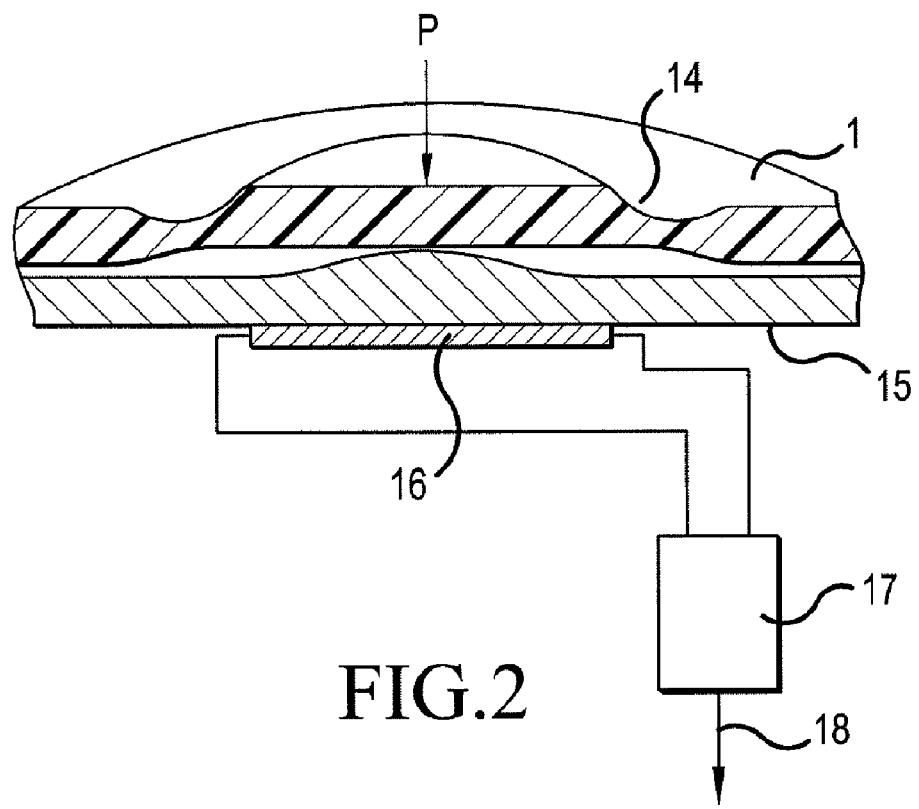
FIG. 2 is a simplified cross-section view of an alternative embodiment showing a portion of a hearing aid or of a control unit with the mechanical coupling of a strain gauge.

The embodiment of FIG. 2 of a control arrangement for hearing aids or for control units coupled to hearing aids allows an hermetic sealing of the hearing aid or the control unit at least in the region where the control arrangement is positioned. The casing 1 of the embodiment shown in FIG. 2, again, can be composed of MID components in an area, where a mechanical actuating force is to be input by a user. The wall of the casing has ring shaped thinned wall portions 14 which, in connection with the elastic properties of the material of the casing wall, allow a snap actuation in a manner known by the skilled person in this technical field so that the user may obtain a tactile feedback of the operation of the control arrangement.

Underneath the portion of the casing wall, where an actuating force is input, there is a support 15 being in contact with the casing wall as shown in FIG. 2 and carrying a strain gauge 16 which, as also mentioned before, cooperates with a controller 17 which provides a control signal on output line 18 upon snap actuation of the elastically deapplication formable portion of the casing 1 because of the resulting change of an electrical property, particularly of the resistance of the strain gauge 16.

In accordance with a modification not shown in the drawings, the support 15 and the strain gauge 16 bonded thereto, of the embodiment of FIG. 2, could be replaced by the cantilever support 9 and the strain gauge 11 of the embodiment of FIG. 1. In this case, the finger tip portion of the cantilever support 9 would be directed upward so that it contacts the lower surface of the casing wall 1 in the range where a snap actuation by an actuating force is initiated.

Figure 3:
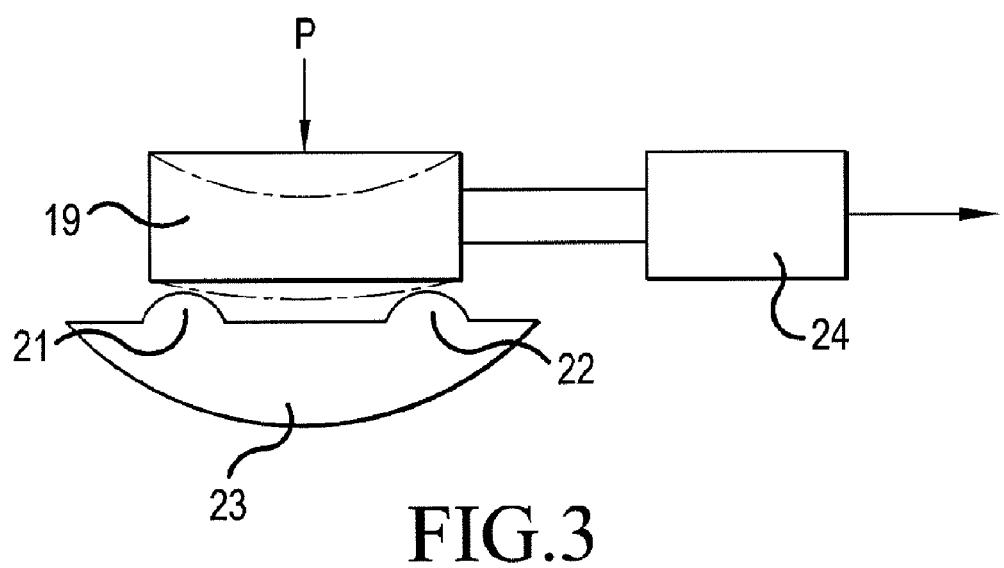
FIGS. 3 and 4 show different embodiments of strain gauges and controllers connected thereto.
Figure 4:
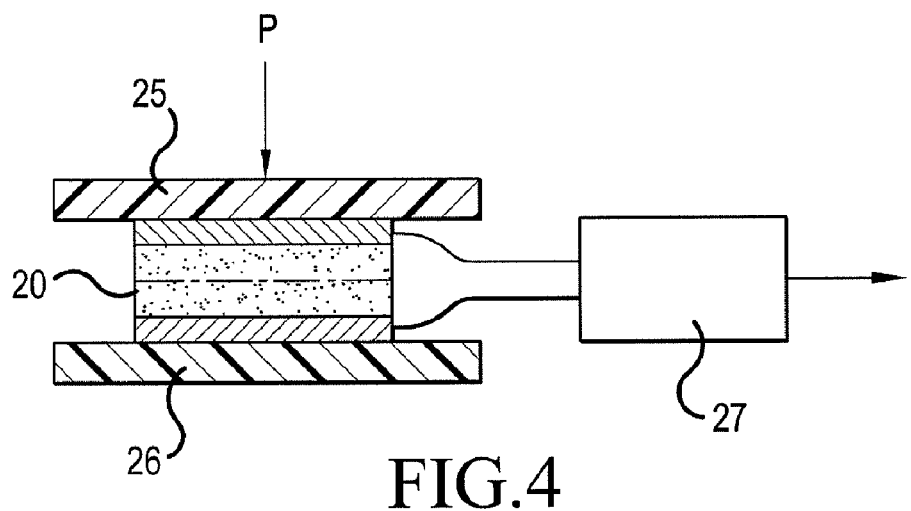

FIGS. 3 and 4 show possible deformations of the strain gauge 19 of FIG. 3 and of the strain gauge 20 of FIG. 4 by the mechanical actuating force P input by the user. The strain gauge 19 of the embodiment of FIG. 3 could be supported from underneath by two ridges 21 and 22 protruding from a plastic support provided on a frame structure inside the hearing aid or the control unit coupled thereto so that the strain gauge 19 is elastically deformed by bending. This bending could cause a predetermined electrical potential difference between surfaces of the strain gauge 19 if this strain gauge is e.g. a piezoelectric crystal. The detected potential difference is transformed into the control signal by the controller 24.

In the embodiment of FIG. 4 the strain gauge 20 is sandwiched between an elastically deformable wall 25 and a support wall 26 connected to an inner frame work within the casing. The wall 25 and the support wall 26 are of insulating material. The strain gauge has the shape of a condenser with an elastically compressible dielectric. A mechanical actuating force P, because of compression of the dielectric, changes the capacitance of the strain gauge 20. This variation of the capacitance is detected by the controller 27 which provides the desired control signal for switching over between operation modes of the respective hearing aid.

Figure 5:
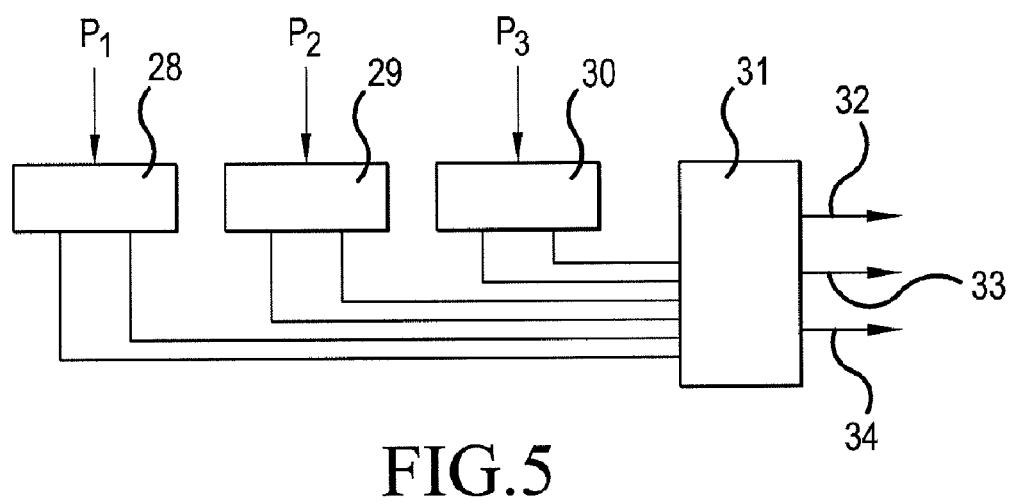
FIG. 5 shows a further embodiment with a plurality of strain gauges for detecting different mechanical actuating forces input by a user.

FIG. 5 shows in schematic form a further development wherein a series of strain gauges 28, 29, 30 can be excited by selectively inputting mechanical operating forces P1 or P2 or P3, respectively, whereupon the allocated controller 31 detecting the respective electrical values of the strain gauges, may provide control signals on output line 32 or output line 33 or output line 34. The structure of the strain gauges 28, 29 and 30, the corresponding elastically deformable or displaceable portions of the hearing aid or the control unit coupled thereto can be chosen by the person skilled in the art according to the embodiments described above in connection with FIGS. 1 to 4. It should be mentioned that also in the case of a series arrangement of strain gauges and corresponding actuating means, the miniaturization, reliability of operation and wear resistance as well as the resistance against penetration of moisture and dust does not cause any problems so that the structure and design as suggested by the present invention is extraordinary appropriate to the hearing aid technology.

Figure 6:
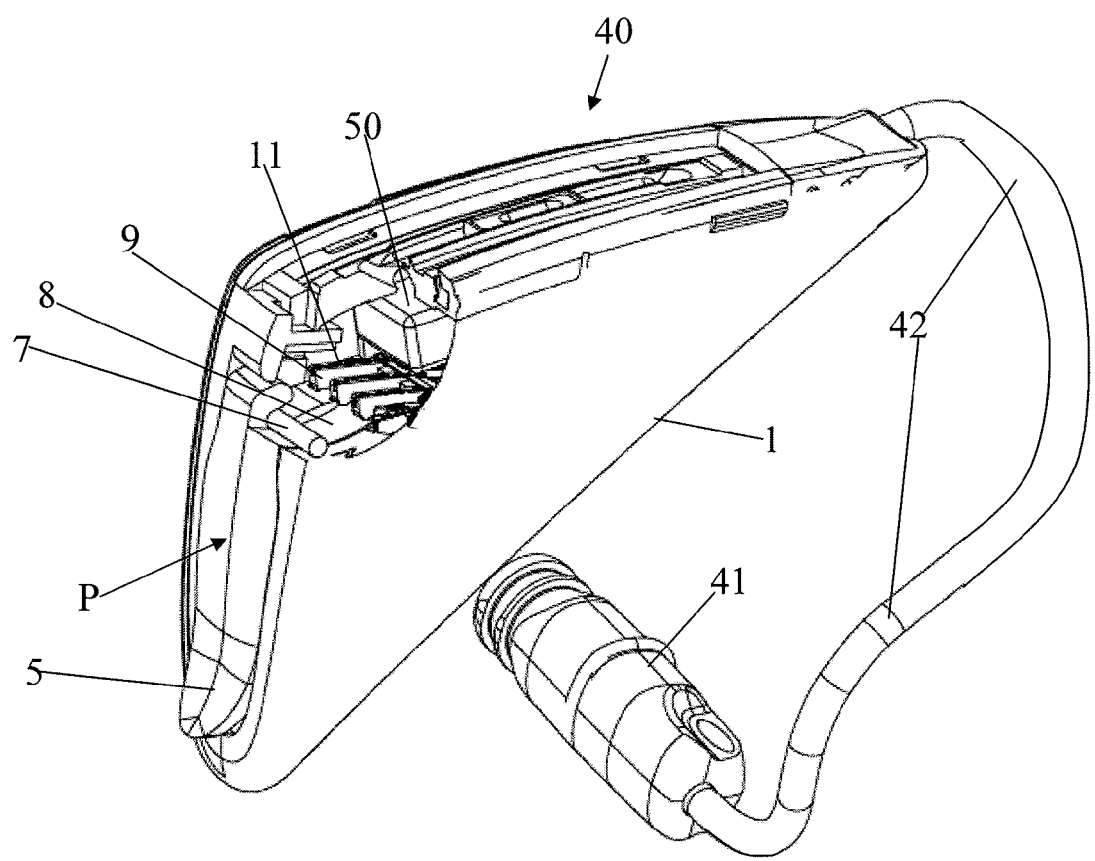
FIG. 6 shows an example of a hearing aid with a control arrangement according to an embodiment of the present invention.

FIG. 6 shows a further example of a hearing aid with a control arrangement according to the invention. The hearing aid 40 comprises a casing 1 which encloses a battery, one or more microphones 50, and a signal processor. An output transducer 41, which delivers a signal to the user perceivable as sound is also present, and in the example of FIG. 6 the output transducer 41 is a hearing aid receiver, which is connected to the signal processor through leads 42 and which may be placed in or at the ear canal of the user. Other output transducer arrangements are well known in the art, such as a receiver placed inside the casing 1 and being connected to the ear canal through a sound guide. As in the example of FIG. 1 a battery lid 5 is provided, such that the power source comprising a battery may be exchanged. Further the battery lid 5 comprises a plate like protrusion 8, which when the a force P is exerted onto the battery lid 5 from the outside will force a cantilever 9 in the upward direction, thereby exerting a bending force on the cantilever 9. The lid 5 is hinged on a hinge pin or axle 7 as is known in the art. A strain gauge 11 on the cantilever 9 which is monitored by a part of the signal processor will thereby be stretched or compressed and this will change an electric property of the strain gauge 11 and as explained this change will be registered in the processor. The cantilever 9 shown in FIG. 6 differs from the cantilever in FIG. 1 in that it is part of an insert provided inside the casing 1.

Figure 7:
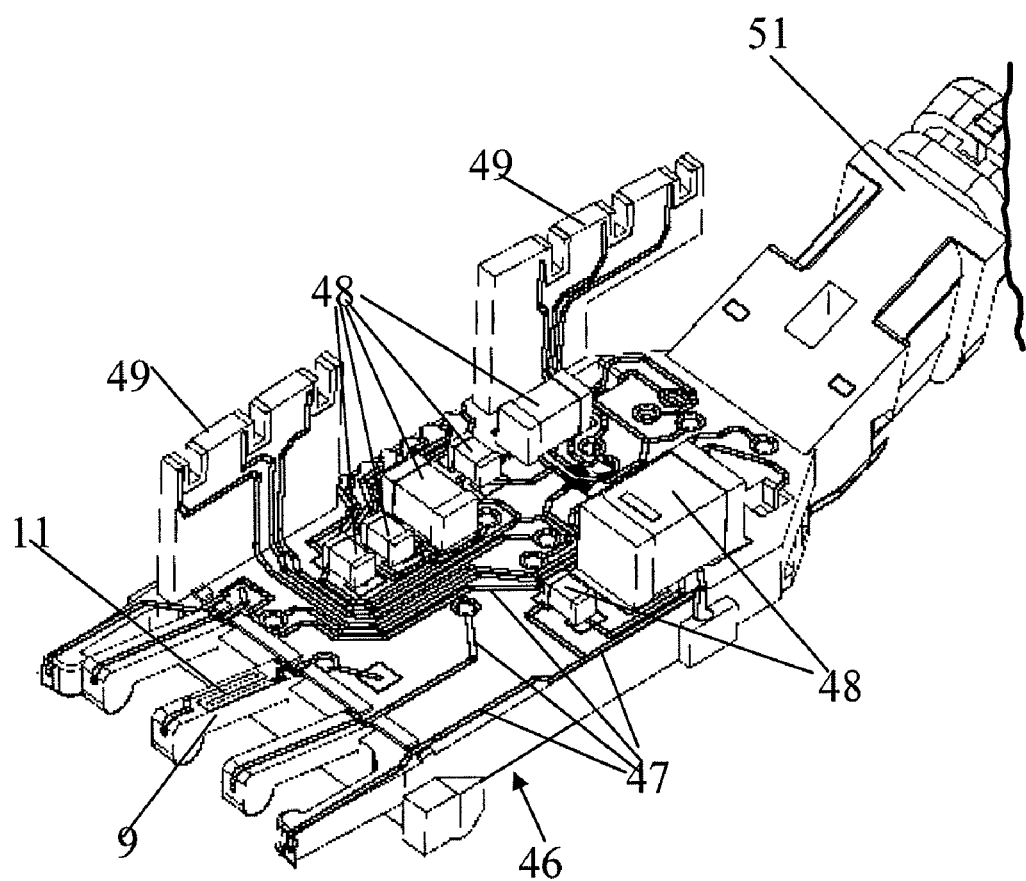
FIG. 7 shows a hearing aid insert having a control arrangement according to an embodiment of the present invention.

The insert 46 is shown without the casing 1 in FIG. 7. The insert 46 is a molded polymer device, and it comprises electric leads 47 provided on surface parts thereof. This is usually not possible with polymer parts. However, by various newly developed methods it has become possible to add metal lanes directly onto surfaces of polymer parts and to solder electronic components to gain contact with the lanes. In this way electric circuitry is formed without the use of a PCB and the electric leads are running directly on the surfaces of a polymer surface and interconnects various electronic components mounted on the surface. An example of such a polymer part is shown in FIG. 7. Here a large number of electric leads 47 are provided on the surface of the insert 46 such that all electric parts of the hearing aid may be interconnected there through. On the top surface visible in FIG. 7 passives such has capacitors 48 are provided and on the opposite side, which is not visible in FIG. 7 signal processors such as one or more IC devices may further be provided. The molded device comprise stands 49 whereto microphones 50 may be welded in usual welding processes. A microphone 50 is visible through the cut away part in FIG. 6. In FIG. 7 also a connector element 51 can be seen, which is operative to receive the leads 42 which connects the receiver 48 with the signal processor.

The strain gauge 11 in FIG. 1 and FIG. 7 may be provided as a part of the application of the leads onto the surface of the molded device 45 or onto the inside surface of the casing 1 as shown in FIG. 1.

The invention claimed is:

1. A control arrangement for a hearing aid or for a control unit coupled to the hearing aid, said control arrangement receiving, as an input, a mechanical actuating force from a user and generating, in response thereto, an electrical control signal for controlling at least one functionality of the hearing aid or the control unit coupled thereto, the control arrangement comprising:

a strain gauge mechanically coupled to an inner surface of an elastically deformable or displaceable portion of the hearing aid or of the control unit coupled thereto and being elastically deformed under the influence of said actuating force, wherein said strain gauge undergoes a variation of at least one of its electrical values dependent from the input of the actuating force;

a controller electrically connected to said strain gauge transforming said variation of said at least one of the electrical values of said strain gauge into said electrical control signal by a circuit free of galvanic closing and opening contacts; and an elastically deformable support comprising a cantilever beam with either a battery or a programming connection formed therewith, wherein said strain gauge is provided in or on the elastically deformable support.

2. The control arrangement in accordance with claim 1, wherein said at least one electrical value is resistance or capacitance or inductance of said strain gauge.

3. The control arrangement in accordance with claim 1, wherein said strain gauge comprises a piezoelectrical crystal.

4. The control arrangement in accordance with one of the claims 1 to 3, wherein the strain gauge, under influence of said actuating force, is compressed or expanded or bent or twisted.

5. The control arrangement in accordance with claim 1, wherein the elastically deformable support is a part of a molded interconnect device.

6. The control arrangement in accordance with claim 5, wherein the support is deformable by mechanical deformation or displacement of a portion of a casing of the hearing aid or the control unit coupled thereto.

7. The control arrangement in accordance with claim 5, wherein the molded interconnect device includes a stand with solder points operable to receive a microphone.

8. The control arrangement in accordance with claim 5, wherein the molded interconnect device includes a connector element operable to receive leads for connecting a receiver with a signal processor.

* * * * *